United States Patent
Terauchi et al.

(10) Patent No.: US 11,532,424 B2
(45) Date of Patent: Dec. 20, 2022

(54) INDUCTANCE ELEMENT AND ELECTRONIC DEVICE

(71) Applicant: TAIYO YUDEN CO., LTD., Tokyo (JP)

(72) Inventors: Naoya Terauchi, Takasaki (JP); Takayuki Arai, Takasaki (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 434 days.

(21) Appl. No.: 16/685,988

(22) Filed: Nov. 15, 2019

(65) Prior Publication Data

US 2020/0176170 A1 Jun. 4, 2020

(30) Foreign Application Priority Data

Nov. 29, 2018 (JP) .............................. JP2018-224210

(51) Int. Cl.
*H05K 1/18* (2006.01)
*H01F 27/28* (2006.01)
*H01F 27/29* (2006.01)

(52) U.S. Cl.
CPC ....... *H01F 27/2804* (2013.01); *H01F 27/292* (2013.01); *H05K 1/181* (2013.01);
(Continued)

(58) Field of Classification Search
CPC ............... H01F 27/2804; H01F 27/292; H01F 2027/2809; H05K 1/181
See application file for complete search history.

(56) References Cited

U.S. PATENT DOCUMENTS

2011/0121930 A1* 5/2011 Takeuchi ............ H01F 41/0246
   336/96
2016/0372246 A1* 12/2016 Otsubo ............... H01F 17/0013
(Continued)

FOREIGN PATENT DOCUMENTS

CN     103035357 A     4/2013
CN     107452463 A    12/2017
(Continued)

OTHER PUBLICATIONS

A Notice of Reasons for Refusal issued by the Japanese Patent Office, dated Jan. 26, 2021, for Japanese counterpart application No. 2018-224210. (4 pages).
(Continued)

*Primary Examiner* — Hoa C Nguyen
(74) *Attorney, Agent, or Firm* — Law Office of Katsuhiro Arai (57) ABSTRACT

An inductance element includes: an insulative substrate body of a rectangular solid shape having length dimension L, height dimension H, and width dimension W, where $1.5 \leq W/H$; at least one internal conductor built in the substrate body and capable of making an electrical current flow therethrough in one uniform direction orthogonal to a cross-section of the substrate body; and a pair of external electrodes provided on the surface of the substrate body in a manner respectively connected to both ends of the internal conductor, so that the internal conductor can make an electrical current flow therethrough in the one uniform direction; wherein, in the cross-section of the substrate body, a rectangular internal conductor region having height dimension Eh and width dimension Ew surrounds the internal conductor in a manner contacting the outermost positioned portions of the internal conductor in the height and width directions, wherein $Ew/Eh > W/H$.

8 Claims, 8 Drawing Sheets

(52) U.S. Cl.
CPC ............... *H01F 2027/2809* (2013.01); *H05K 2201/1003* (2013.01)

(56) References Cited

U.S. PATENT DOCUMENTS

| | | | |
|---|---|---|---|
| 2017/0018351 A1* | 1/2017 | Yatabe | H01F 27/2804 |
| 2017/0178797 A1* | 6/2017 | Todorov | H01F 27/2847 |
| 2017/0345558 A1 | 11/2017 | Sekiguchi et al. | |
| 2019/0272945 A1 | 9/2019 | Arai et al. | |
| 2022/0037083 A1* | 2/2022 | Arai | H01F 27/292 |

FOREIGN PATENT DOCUMENTS

| | | |
|---|---|---|
| JP | H10144526 A | 5/1998 |
| JP | 2000068130 A | 3/2000 |
| JP | 2000164431 A | 6/2000 |
| JP | 2003272923 A | 9/2003 |
| JP | 2004165440 A | 6/2004 |
| JP | 2005129589 A | 5/2005 |
| JP | 2019153642 A | 9/2019 |

OTHER PUBLICATIONS

A Notification of Reasons of Refusal issued by the Japanese Patent Office, dated Sep. 15, 2020, for Japanese counterpart application No. 2018-224210. (5 pages).
A Decision of Dismissal of Amendment issued by the Japanese Patent Office, dated May 25, 2021, for Japanese counterpart application No. 2018-224210. (4 pages).
A Decision of Refusal issued by the Japanese Patent Office, dated May 25, 2021, for Japanese counterpad application No. 2018-224210. (1 pages).
A Notice of Reasons for Refusal issued by the Japanese Patent Office, dated Apr. 26, 2022, for Japanese counterpart application No. 2018-224210. (12 pages).
"SMD Based and Chokes", Application Note, Extended range for EMI noise suppression, the United State of America, Ferroxcube, Oct. 2006 (printed URL:https://ferroxcube.home.pl/appl/info/SMD-beads%20&%20chokes%20-%20cover.pdf and https://ferroxcube.home.pl/appl/info/SMD-beads%20&%20chokes%20-%20content.pdf (44 pages)).
A First Office Action issued by the State Intellectual Property Office of China dated Oct. 17, 2022, for Chinese counterpart application No. 201911139493.6 (6 pages).

* cited by examiner

INDUCTANCE ELEMENT AND ELECTRONIC DEVICE

CROSS-REFERENCE TO RELATED APPLICATIONS

The present application claims priority to Japanese Patent Application No. 2018-224210, filed Nov. 29, 2018, the disclosure of which is incorporated herein by reference in its entirety including any and all particular combinations of the features disclosed therein.

BACKGROUND

Field of the Invention

The present invention relates to an inductance element and an electronic device.

Description of the Related Art

Inductance elements, each comprising a substrate body and a linearly extending internal conductor built therein, are known. Such inductance elements are known to have high inductance and provide favorable direct-current superimposition properties when the cross-section shape of the substrate body and the cross-section shape of the internal conductor are made roughly similar (refer to Patent Literature 1, for example).

Background Art Literatures

[Patent Literature 1] Japanese Patent Laid-open No. Hei 10-144526

SUMMARY

Recent years have seen an acceleration of a trend for inductance elements of shorter heights in connection with increasingly smaller electronic devices, as well as a trend for inductance elements of high electrical current amplification in connection with electronic devices offering increasingly higher functions. It is known that, if the height of the inductance element is shortened further and the width-to-height ratio of the substrate body continues to rise, favorable direct-current superimposition properties can no longer be obtained even when the cross-section shape of the substrate body and the cross-section shape of the internal conductor are made roughly similar as described in Patent Literature 1.

The present invention was made in light of the aforementioned problems, and its object is to prevent local magnetic flux concentrations and thereby improve the direct-current superimposition properties.

The present invention is an inductance element comprising: a substrate body having insulation property which has a rectangular solid shape specified by its length dimension L, height dimension H, and width dimension W, where the ratio of the width dimension W to the height dimension H, or W/H value, is 1.5 or greater; one or multiple internal conductors which are built in the substrate body and capable of making an electrical current flow, with respect to a cross-section of the substrate body, in one direction orthogonal to the cross-section; and a pair of external electrodes which are provided on the surface of the substrate body in a manner respectively connected to both ends of the one or multiple internal conductors, so that the one or multiple internal conductors can make an electrical current flow in one direction orthogonal to the cross-section; wherein, assuming that, in the cross-section of the substrate body, the height dimension is denoted by Eh and the width dimension is denoted by Ew for a rectangular internal conductor region surrounding the one or multiple internal conductors in a manner contacting the outermost positioned portions of the one or multiple internal conductors in the height direction and width direction, the ratio of the width dimension Ew, to the height dimension Eh, of the internal conductor region, or Ew/Eh value, is greater than the ratio of the width dimension W, to the height dimension H, of the substrate body, or W/H value.

In the aforementioned constitution, it may be constituted in such a way that the dimensions of the substrate body satisfy "Length dimension L>Width dimension W>Height dimension H."

In the aforementioned constitution, it may be constituted in such a way that the substrate body is formed in a manner containing a magnetic metal material or ferrite material, while the one or multiple internal conductors are formed in a manner containing at least one type of material selected from silver, copper, and alloys containing at least one of silver and copper.

In the aforementioned constitution, it may be constituted in such a way that the one or multiple internal conductors are provided in multiple rows in the height direction of the substrate body.

The present invention is an electronic device comprising: the aforementioned inductance element; and a circuit board on which the inductance element is mounted.

According to the present invention, local magnetic flux concentrations can be prevented and the direct-current superimposition properties improved as a result.

BRIEF DESCRIPTION OF THE DRAWINGS

FIG. 1A is a transparent perspective view of the inductance element pertaining to Example 1, while

FIG. 7A is a perspective view of the inductance element pertaining to Example 4, while

DESCRIPTION OF THE SYMBOLS

10 Substrate body
12 Top face
14 Bottom face
16a, 16b End face
18a, 18b Side face
30, 30a Internal conductor
32 Internal conductor region
50a, 50b External electrode
80 Circuit board
82 Land electrode 84 Solder
100, 200, 300, 400 Inductance element
500 Electronic device

DETAILED DESCRIPTION OF EMBODIMENTS

Examples of the present invention are explained below by referring to the drawings.

Example 1

Figure 1A:
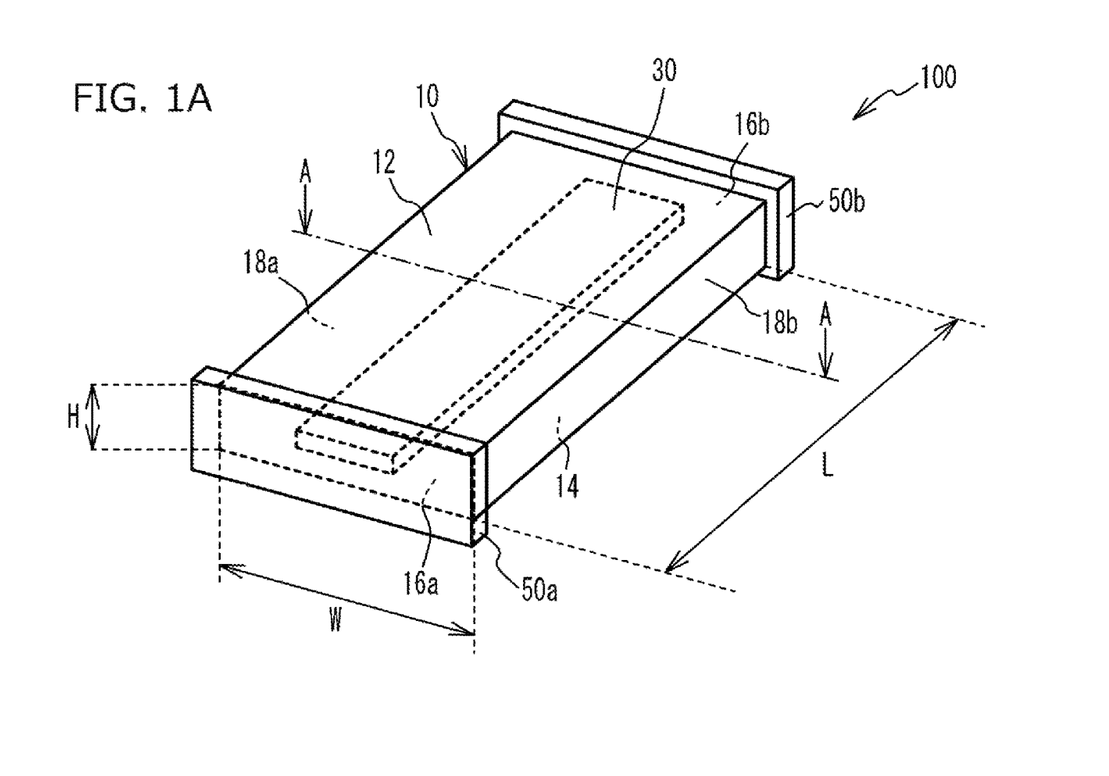
Figure 1B:
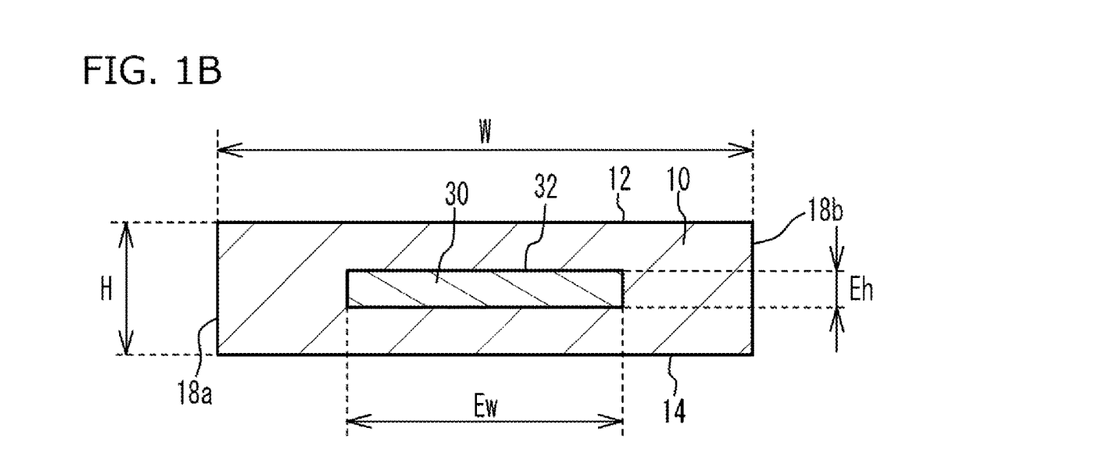
FIG. 1B is a view of cross-section A-A in FIG. 1A.

FIG. 1A is a transparent perspective view of the inductance element pertaining to Example 1, while FIG. 1B is a view of cross-section A-A in FIG. 1A. As shown in FIGS. 1A and 1B, the inductance element 100 in Example 1 comprises a substrate body 10, an internal conductor 30, and external electrodes 50a, 50b.

The substrate body 10 is shaped as a rectangular solid having a top face 12, a bottom face 14, a pair of end faces 16a, 16b, and a pair of side faces 18a, 18b. The bottom face 14 is a mounting face, while the top face 12 is a face on the opposite side of the bottom face 14. The end faces 16a, 16b are faces connected to the short sides of the top face 12 and bottom face 14. The side faces 18a, 18b are faces connected to the long sides of the top face 12 and bottom face 14. The spacing between the end face 16a and the end face 16b defines the length dimension L of the substrate body 10. The spacing between the top face 12 and the bottom face 14 defines the height dimension H of the substrate body 10. The spacing between the side face 18a and the side face 18b defines the width dimension W of the substrate body 10.

The substrate body 10 is such that its height dimension H is shorter than its width dimension W. In other words, it has the relationship of "Width dimension W>Height dimension H." This means that the height-direction dimension of the inductance element 100 can be decreased, which contributes to thickness reduction at the time of mounting. Also, the substrate body 10 can have its length dimension L made longer than its width dimension W. In other words, it has the relationship of "Length dimension L>Width dimension W>Height dimension H" in this case. This means that the length dimension L can be increased, which makes it easy to ensure inductance property.

It should be noted that the substrate body 10 is not limited to a complete rectangular solid shape; instead, it may have, for example, rounded corners, rounded ridges (boundary parts of faces), or curved faces. In other words, the substrate body 10 of rectangular solid shape includes substrate bodies 10 having these roughly rectangular solid shapes.

The substrate body 10 has insulation property and is formed in a manner containing a magnetic metal material, ferrite material, or other magnetic material, for example. The substrate body 10 is formed in a manner containing a magnetic material as its primary component, for example. "Containing . . . as its primary component" means that the magnetic material is contained by more than 50 percent by weight, where it may be contained by 70 percent by weight or more, or by 80 percent by weight or more, or by 90 percent by weight or more. The substrate body 10 may be formed by a resin that contains magnetic grains, or it may be formed by magnetic grains whose surfaces are insulation-coated. For the magnetic metal material, FeSi, FeSiCr, FeSiAl, FeSiCrAl, FeSiAlBC, Fe, Ni, or other magnetic metal, crystalline magnetic metal, amorphous magnetic metal, or nanocrystal magnetic metal is used, for example. For the ferrite material, NiZn ferrite, MnZn ferrite, etc., is used, for example. For the resin, polyimide resin, phenolic resin, or other thermosetting resin may be used, or polyethylene resin, polyamide resin, or other thermoplastic resin may be used, for example. The insulating film with which to coat the surfaces of magnetic grains may be an insulating film constituted by an oxide of the magnetic grains themselves, or an insulating film constituted by silicon oxide or other inorganic insulating material, for example. It should be noted that the relative permeability of the substrate body 10 is 5 or higher, or preferably 10 or higher, or more preferably 20 or higher. This way, ensuring inductance property becomes easier. Also, the resistivity of the substrate body 10 is $10^6$ Ω·cm or higher, or preferably $10^8$ Ω·cm or higher. This way, insulation property of the substrate body 10 can be ensured.

The internal conductor 30 is built in the substrate body 10. The internal conductor 30 is such that, at the center portion of the substrate body 10 in the length direction, its cross-section orthogonal to the direction of electrical continuity in the internal conductor 30 has a rectangular shape. This cross-section, specifically, is, at the midpoint between the pair of end faces 16a, 16b, a face running parallel with the end faces 16a, 16b, and it is also a face that includes two directions corresponding to the height direction and width direction of the substrate body 10. Here, in the cross-section of the substrate body 10 at the center portion in the length direction, the rectangular region surrounding the internal conductor 30 in a manner contacting the outermost positioned portions of the internal conductor 30 in the height direction and width direction (or specifically in the vertical and lateral directions) is defined as an internal conductor region 32. In Example 1, where one internal conductor 30 having a rectangular cross-section shape is provided, the internal conductor region 32 roughly corresponds to the region in which the internal conductor 30 is present. The height dimension of the internal conductor region 32 is denoted by Eh, while its width dimension is denoted by Ew. Because the height dimension H of the substrate body 10 is shorter than its width dimension W, the height dimension Eh of the internal conductor region 32 is also shorter than its width dimension Ew. Also, in the cross-section of the substrate body 10 at the center portion in the length direction, the internal conductor 30 may be provided at the center part of the substrate body 10 or it may have a point-symmetric shape with respect to the center of the substrate body 10.

The internal conductor 30 is formed by copper, aluminum, nickel, silver, platinum, palladium, or other metal material, or alloy material containing the foregoing. The internal conductor 30 may extend linearly between the end face 16a and end face 16b of the substrate body 10. Because the internal conductor 30 extends linearly, the direct-current resistance of the inductance element 100 can be decreased. Both ends of the internal conductor 30 are exposed from the surface of the substrate body 10, and the external electrodes 50a, 50b are formed on the surfaces of the substrate body 10 that include the exposed portions of the respective ends. Preferably one end of the internal conductor 30 is exposed from the substrate body 10 on the end face 16a of the substrate body 10, while the other end is exposed from the substrate body 10 on the end face 16b of the substrate body 10. It should be noted that the external electrodes 50a, 50b may be formed on surfaces of the substrate body 10 other than the end faces 16a, 16b.

The external electrodes 50a, 50b are external terminals for surface mounting. The external electrodes 50a, 50b, in Example 1, extend from the bottom face 14, via the end face 16a or 16b, to the top face 12, while covering parts of the side faces 18a, 18b, of the substrate body 10. In other words, the external electrodes 50a, 50b are pentahedral electrodes reaching five faces of the substrate body 10. In this case, the internal conductor 30 has one end connected to the external electrode 50a on the end face 16a of the substrate body 10, and the other end connected to the external electrode 50b on the end face 16b of the substrate body 10. It should be noted that the external electrodes 50a, 50b may be trihedral electrodes extending from the bottom face 14, via the end face 16a or 16b, to the top face 12, of the substrate body 10, or they may be dihedral electrodes extending from the bottom face 14, to the end face 16a or 16b, of the substrate body 10. Additionally, if the internal conductor 30 is exposed on a surface of the substrate body 10 other than the end face 16 or 16b, the external electrodes 50a, 50b may be formed on any surface of the substrate body 10 that includes the exposed portion.

The external electrodes 50a, 50b are formed by multiple metal layers, for example. The external electrodes 50a, 50b have a multi-layer structure comprising a bottom layer formed by copper, aluminum, nickel, silver, platinum, palladium, or other metal material, or alloy material containing the foregoing, a middle layer formed by silver or conductive resin containing silver, and a top layer being a nickel and/or tin layer. The layer constitution of the external electrodes 50a, 50b is not limited to the one illustrated; instead, an intermediate layer may be provided between the respective layers, a topmost layer may be provided on top of the top layer, or the like.

Next, a method for manufacturing the inductance element 100 in Example 1 is explained. The inductance element 100 is formed through steps including a step to stack multiple green sheets. A green sheet is an insulating precursor that will constitute the substrate body 10, and is formed by applying a slurry containing magnetic material on a film using the doctor blade method, etc.

First, multiple green sheets are prepared. A conductive material is applied on some of the multiple green sheets using a printing method, for example, to form precursors to internal conductor 30. Next, the multiple green sheets are stacked in a prescribed order and pressure-bonded. The pressure-bonded green sheets are cut to individual chips using a dicer, press cutter, etc., and then sintered at a prescribed temperature. When sintered, the precursors to internal conductor 30 turn into an internal conductor 30. This way, a substrate body 10 where the internal conductor 30 is built-in, is formed.

Next, external electrodes 50a, 50b are formed on the surface of the substrate body 10. The external electrodes 50a, 50b are formed by means of paste printing, plating, sputtering, or other method used in thin-film processes.

Here, simulations conducted by the inventor of the present invention are explained. The inventor of the present invention conducted simulations using four samples 1 to 4 that each represent the inductance element 100 explained in FIGS. 1A and 1B, with a varying ratio of width dimension W to height dimension H, or W/H value, of the substrate body 10. Also, in samples 1 to 4, the substrate body 10 was formed by a soft magnetic metal material (FeSiCr, relative permeability 25) and the internal conductor 30 was formed by silver.

Sample 1 had both its height dimension H and width dimension W adjusted to 0.8 mm, to a W/H value of 1.

Sample 2 had its height dimension H adjusted to 0.533 mm and its width dimension W, to 0.8 mm, to a W/H value of 1.5.

Sample 3 had its height dimension H adjusted to 0.4 mm and its width dimension W, to 0.8 mm, to a W/H value of 2.

Sample 4 had its height dimension H adjusted to 0.2 mm and its width dimension W, to 0.8 mm, to a W/H value of 4.

Figure 2:
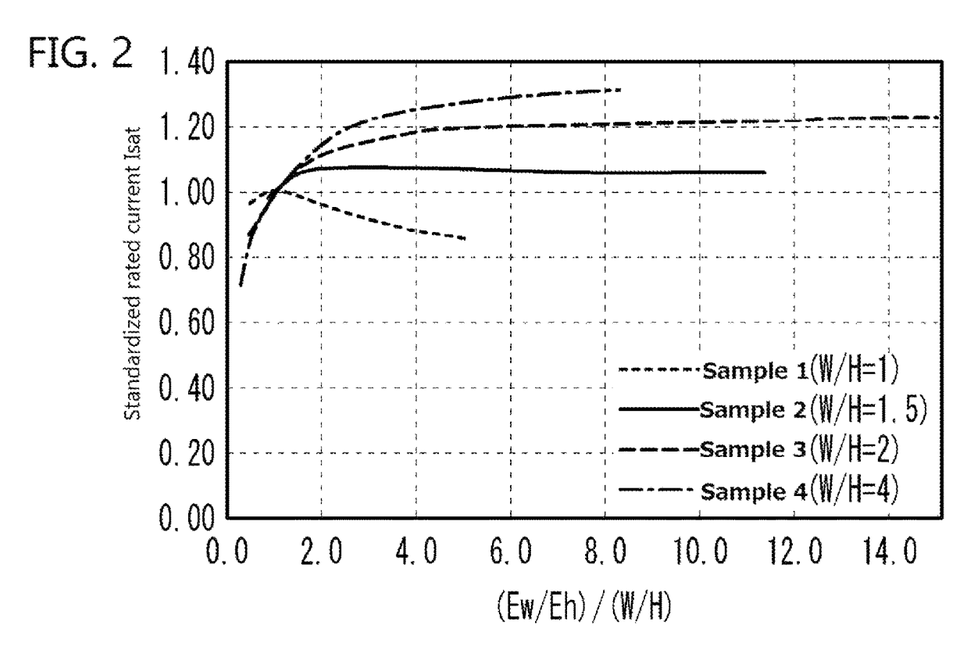
FIG. 2 shows the simulation results of rated currents Isat for samples 1 to 4.

For each of samples 1 to 4, the rated current Isat was calculated by maintaining a constant inductance while changing the thickness and width of the internal conductor 30, or specifically the height dimension Eh and width dimension Ew of the internal conductor region 32. FIG. 2 shows the simulation results of rated currents Isat for samples 1 to 4. The horizontal axis in FIG. 2 represents the value of (Ew/Eh)/(W/H) obtained by dividing the ratio of width dimension Ew to height dimension Eh, or Ew/Eh value, of the internal conductor region 32, by the ratio of width dimension W to height dimension H, or W/H value, of the substrate body 10. The vertical axis in FIG. 2 represents the standardized rated current Isat, standardized by the rated current Isat when the value of (Ew/Eh)/(W/H) is 1. When (Ew/Eh)/(W/H) along the horizontal axis is 1, it means that the cross-section shape of the substrate body 10 and the shape of the internal conductor region 32 are similar. The greater the value of (Ew/Eh)/(W/H), the horizontally longer the shape of the internal conductor region 32 becomes relative to the cross-section shape of the substrate body 10.

As shown in FIG. 2, sample 1 exhibited the highest rated current Isat when the value of (Ew/Eh)/(W/H) was 1. Specifically, sample 1 has a W/H value of 1, which means that the cross-section shape of the substrate body 10 is a square. In this case, the rated current Isat became the highest when the shape of the internal conductor region 32 was made similar to the cross-section shape of the substrate body 10.

With samples 2 to 4, on the other hand, the rated current Isat increased when the value of (Ew/Eh)/(W/H) was greater than 1. Specifically, samples 2 to 4 have a W/H value of 1.5 or greater, which means that the cross-section shape of the substrate body 10 is a horizontally-long rectangle. In this case, the rated current Isat increased when the relationship of "Ew/Eh>W/H" was satisfied. The reason for this is explained below.

Figure 3A:
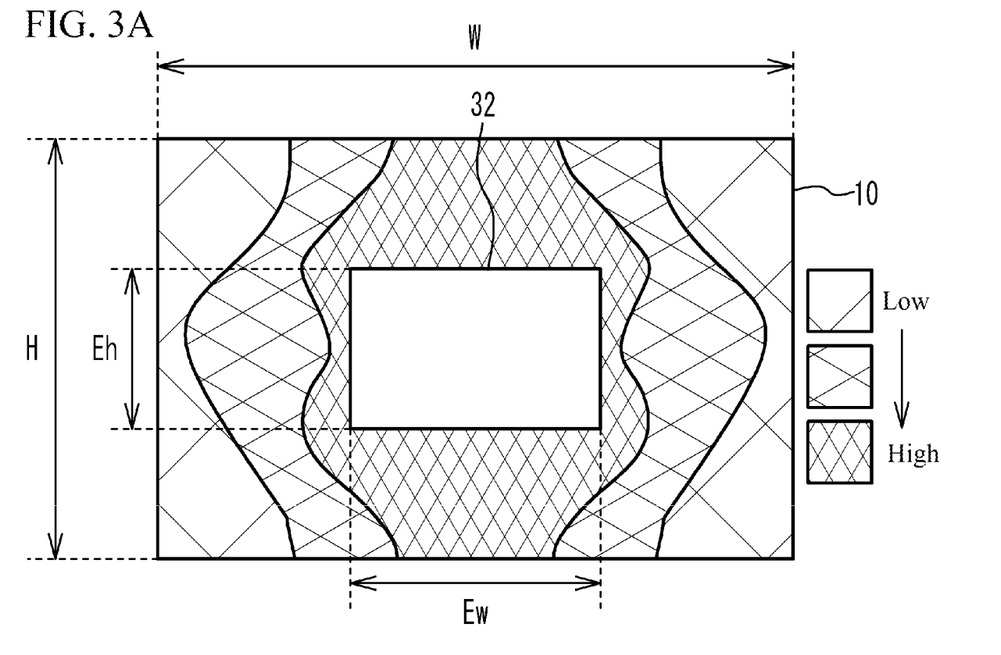
FIGS. 3A and 3B show the simulation results (1) of magnetic flux density distributions for sample 2.
Figure 3B:
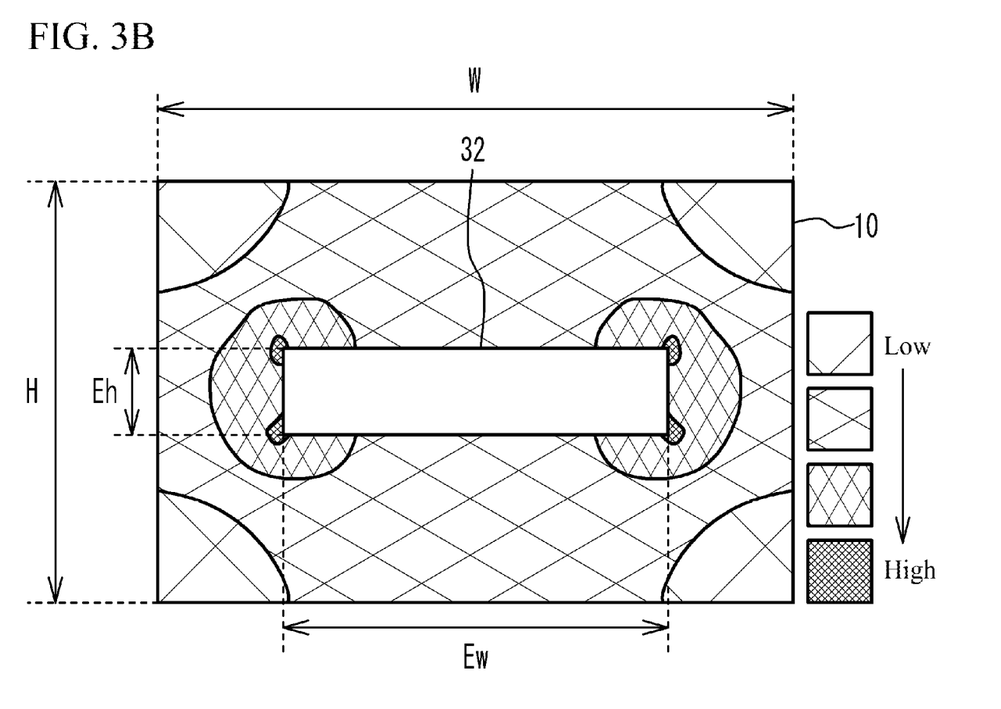

FIGS. 3A and 3B show the simulation results (1) of magnetic flux density distributions for sample 2. In FIGS. 3A and 3B, the level of magnetic flux density is expressed by the density of hatching, where a dense hatching region indicates a higher magnetic flux density. FIG. 3A shows the simulation result of magnetic flux density distribution based on the width and thickness of the internal conductor 30 being 320 μm and 213.3 μm, respectively. In other words, the simulation result reflects the width dimension Ew of 320 μm and height dimension Eh of 213.3 μm, or the Ew/Eh value of 1.5, for the internal conductor region 32, meaning that the shape of the internal conductor region 32 is similar to the cross-section shape of the substrate body 10. FIG. 3B shows the simulation result of magnetic flux density distribution based on the width and thickness of the internal conductor 30 being 480 μm and 105.5 μm, respectively. In other words, the simulation result reflects the width dimension Ew of 480 μm and height dimension Eh of 105.5 μm, or the Ew/Eh value of 4.6, for the internal conductor region 32, meaning that the shape of the internal conductor region 32 is horizontally longer compared to the cross-section shape of the substrate body 10.

As shown in FIG. 3A, there are large regions of high magnetic flux densities as well as large regions of low magnetic flux densities when the W/H value and Ew/Eh value are both 1.5. This means that, when the value of (Ew/Eh)/(W/H) is 1, the magnetic fluxes are not distributed widely over the entirety of the substrate body 10.

As shown in FIG. 3B, on the other hand, regions of high magnetic flux densities and low magnetic flux densities are both small when the W/H value is 1.5 and the Ew/Eh value is 4.6. Meanwhile, there are large regions of intermediate magnetic flux densities distributed widely over the substrate body 10. This suggests that, when the Ew/Eh value is greater than the W/H value, the magnetic fluxes are distributed instead of concentrating around the internal conductor 30 in the substrate body 10, thereby preventing magnetic flux concentrations above and below the internal conductor region 32 and improving the direct-current superimposition properties.

Accordingly, when the ratio of width dimension W to height dimension H, or W/H value, of the substrate body 10 is 1.5 or greater, satisfying the relationship of "Ew/Eh>W/H" allows the magnetic fluxes to be distributed instead of concentrating around the internal conductor 30 in the substrate body 10, thereby preventing magnetic flux concentrations. This suggests that, in FIG. 2, the direct-current superimposition properties improved and thus the rated current Isat increased in samples 2 to 4, whose W/H value was 1.5 or greater, when the relationship of "Ew/Eh>W/H" was satisfied. It should be noted that these results are not limited to the materials used in the simulations, and that similar results will likely be obtained for the aforementioned reasons when other magnetic materials or nonmagnetic materials are used.

Based on the above, Example 1 uses a substrate body 10 having insulation property whose ratio of width dimension W to height dimension H, or W/H value, is 1.5 or greater (W/H≥1.5). Here, the ratio of width dimension Ew to height dimension Eh, or Ew/Eh value, of the internal conductor region 32, is made greater than the ratio of width dimension W to height dimension H, or W/H value, of the substrate body 10. This way, local magnetic flux concentrations can be prevented and the direct-current superimposition properties improved. This allows the rated current Isat to be increased, and an inductance element capable of supporting high electrical current amplification can be obtained.

As shown in FIG. 2, the value of (Ew/Eh)/(W/H) is preferably 1.5 or greater, or more preferably 2 or greater, or yet more preferably 3 or greater, from the viewpoint of improving the direct-current superimposition properties. If the W/H value is 1.5 or greater but smaller than 2, for example, preferably the value of (Ew/Eh)/(W/H) is 2 or greater but no greater than 4. Although the direct-current superimposition properties improve when the value of (Ew/Eh)/(W/H) is 4 or greater, it diminishes the improvement effect. If the W/H value is 2 or greater, for example, the value of (Ew/Eh)/(W/H) is preferably 4 or greater, or more preferably 5 or greater. It should be noted, however, that increasing the value of (Ew/Eh)/(W/H) excessively does not greatly improve the direct-current superimposition properties.

Figure 4:
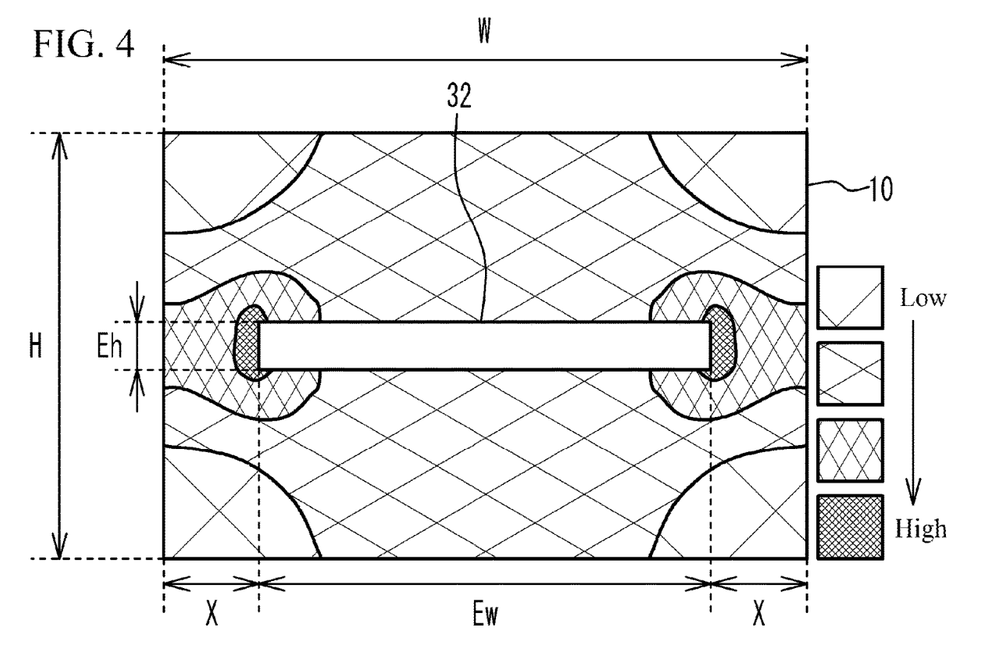
FIG. 4 shows the simulation result (2) of magnetic flux density distribution for sample 2.

FIG. 4 shows the simulation result (2) of magnetic flux density distribution for sample 2. In FIG. 4, the level of magnetic flux density is expressed by the density of hatching, where a dense hatching region indicates a higher magnetic flux density. FIG. 4 shows the simulation result of magnetic flux density distribution based on the width and thickness of the internal conductor 30 being 560 μm and 55 μm, respectively. In other words, the simulation result reflects the width dimension Ew of 560 μm and height dimension Eh of 55 μm, or the Ew/Eh value of 10.2, for the internal conductor region 32. Here, the value of (Ew/Eh)/(W/H) is 6.8. As shown in FIG. 4, regions of high magnetic flux densities in the substrate body 10 are distributed from the side faces of the internal conductor region 32 to the side faces of the substrate body 10. This represents a state where the magnetic fluxes are concentrated in the so-called side margin parts that are parts of the substrate body 10 between the side faces of the internal conductor 30 and the side faces of the substrate body 10. This is likely why, as shown in FIG. 2, the effect of improving the direct-current superimposition properties is diminished and the effect of improving the rated current Isat is lessened in sample 2 when the (Ew/Eh)/(W/H) value is 6.8.

FIG. 4 shows the simulation result based on the width dimension W of 800 μm for the substrate body 10 and the width dimension Ew of 560 μm for the internal conductor region 32. In other words, the simulation result reflects that the width dimension Ew of the internal conductor region 32 is 0.7 times the width dimension W of the substrate body 10. Considering that, in this case, the magnetic fluxes are concentrated in the side margin parts and the effect of improving the rated current Isat is lessened, preferably the width dimension Ew of the internal conductor region 32 is less than 0.7 times the width dimension W of the substrate body 10. Additionally, when the spacing between each of a pair of sides of the internal conductor region 32 orthogonal to the width direction of the substrate body 10, and a side of the substrate body 10 close to each of the aforementioned pair of sides orthogonal to the width direction of the substrate body 10, is denoted by X in FIG. 4, then preferably the dimension of this spacing X is at least 0.15 times the width dimension W of the substrate body 10. It should be noted that, from manufacturing viewpoints, the thickness of the internal conductor 30 is preferably 10 μm or greater, or more preferably 12 μm or greater, or yet more preferably 15 μm or greater. Also, the internal conductor 30 need not be always placed at the center of the substrate body 10 in the height direction or width direction; instead, it only needs to be inside a range where the dimension of the spacing X is satisfied, for example. The same goes with the height direction.

Preferably the substrate body 10 is formed in a manner containing a magnetic metal material or ferrite material, while the internal conductor 30 is formed in a manner containing at least one type of material selected from silver, copper, and alloys containing at least one type of silver and copper. This way, the magnetic body in the substrate body 10 can be utilized effectively to allow the magnetic fluxes to be distributed widely over the entirety of the substrate body 10 in an effective manner, which in turn further prevents magnetic flux concentrations.

Example 2

Figure 5:
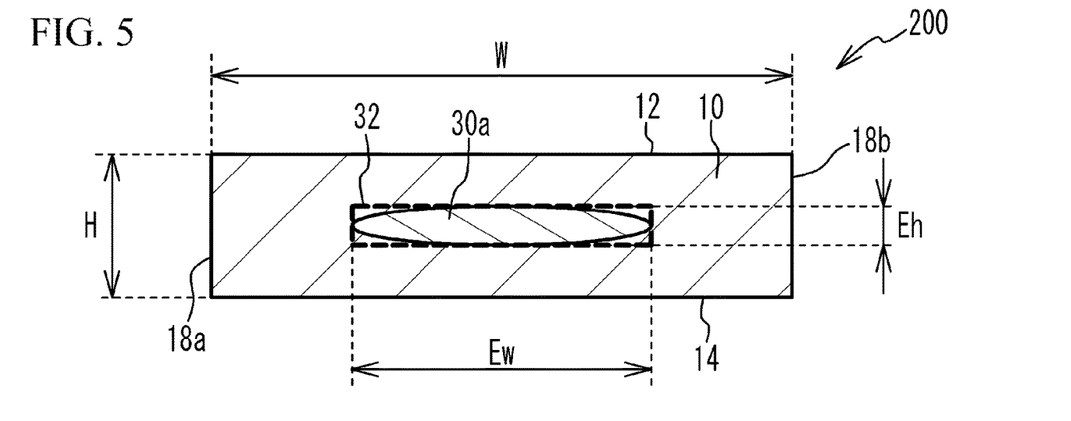
FIG. 5 is a cross-sectional view of the inductance element pertaining to Example 2.

FIG. 5 is a cross-sectional view of the inductance element pertaining to Example 2. As shown in FIG. 5, the inductance element 200 in Example 2 has an internal conductor 30*a* whose cross-section shape is an oval. In this case, too, the internal conductor region 32 represents a rectangular region surrounding the internal conductor 30*a* in a manner contacting the outermost positioned portions of the internal conductor 30*a* in the height direction and width direction (or specifically in the vertical and lateral directions). The remaining constitutions are the same as those in Example 1 and therefore not explained.

It is clear from Example 2 that, even when the cross-section shape of the internal conductor 30*a* is an oval, an inductance element offering improved direct-current superimposition properties can be obtained by making the ratio of width dimension Ew to height dimension Eh, or Ew/Eh value, of the internal conductor region 32, greater than the ratio of width dimension W to height dimension H, or W/H value, of the substrate body 10. Also, the internal conductor 30a can have a cross-section shape other than an oval, such as a trapezoid, parallelogram, elongated rounded tetragon, rounded rectangle, etc., and still achieve similar effects so long as the internal conductor region 32 is similarly defined. The cross-section shape of the internal conductor 30a is selected in any way as deemed appropriate for manufacturing process and productivity reasons.

Example 3

Figure 6:
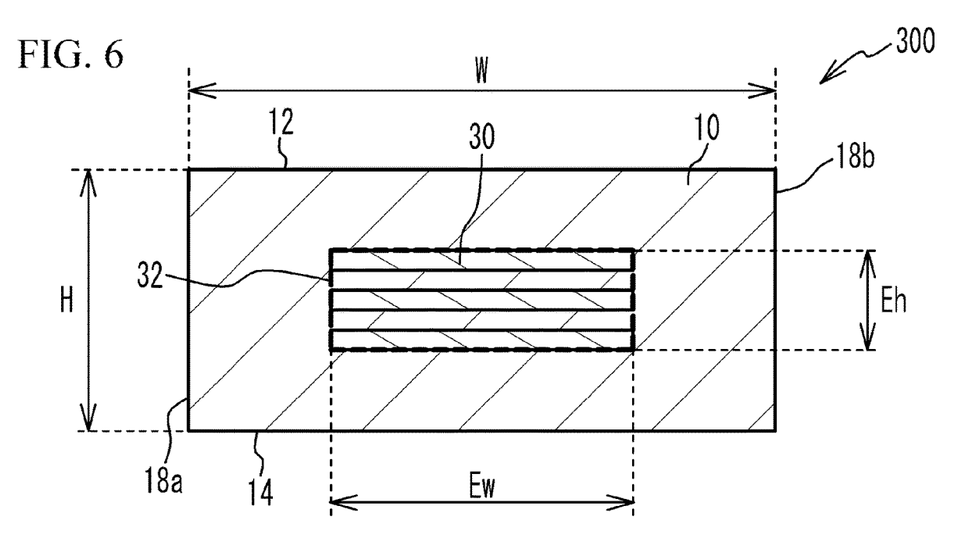
FIG. 6 is a cross-sectional view of the inductance element pertaining to Example 3.

FIG. 6 is a cross-sectional view of the inductance element pertaining to Example 3. As shown in FIG. 6, the inductance element 300 in Example 3 is such that multiple (three, here) internal conductors 30 are provided in layers in the height direction of the substrate body 10. Specifically, the multiple internal conductors 30 are connected in parallel with one another between the external electrode 50a and the external electrode 50b. In other words, the multiple internal conductors 30 are connected in a manner allowing an electrical current to flow in one direction orthogonal to the cross-sections of the internal conductors 30. Such structure is used in cases where producing an internal conductor 30 of large height-direction dimension is difficult with a printing method, etc., and it can increase the total cross-section area of the parallelly-connected internal conductors 30. Preferably the spacing between adjacent internal conductors 30 is small from the viewpoints of electrical properties, but it may be set to approx. 1 μm to 10 μm for ease of handling to produce internal conductors 30 separately. When multiple internal conductors 30 are provided, the internal conductor region 32 represents a rectangular region surrounding the multiple internal conductors 30 together in a manner contacting the outermost positioned portions of the multiple internal conductors 30 in the height direction and width direction (or specifically in the vertical and lateral directions). The remaining constitutions are the same as those in Example 1 and therefore not explained.

It is clear from Example 3 that, even when multiple internal conductors 30 are provided, an inductance element offering improved direct-current superimposition properties can be obtained by making the ratio of width dimension Ew to height dimension Eh, or Ew/Eh value, of the internal conductor region 32, greater than the ratio of width dimension W to height dimension H, or W/H value, of the substrate body 10. Also, because multiple internal conductors 30 are provided in layers in the height direction of the substrate body 10 and connected to one another in parallel, the current flowing between the external electrode 50a and the external electrode 50b can be made lower in resistance.

Example 4

Figure 7A:
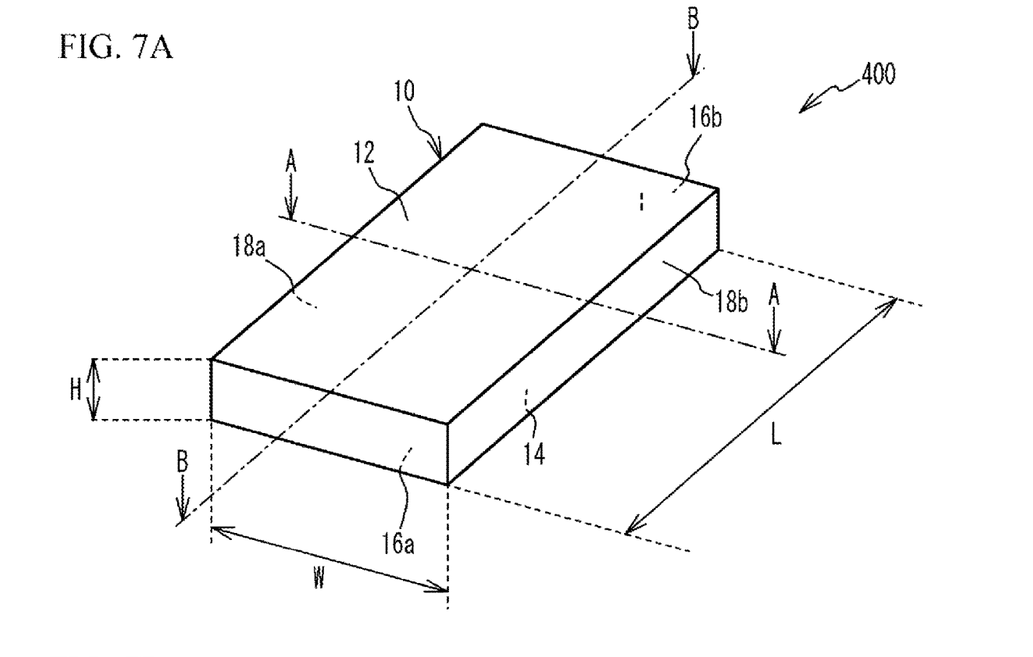
Figure 7B:
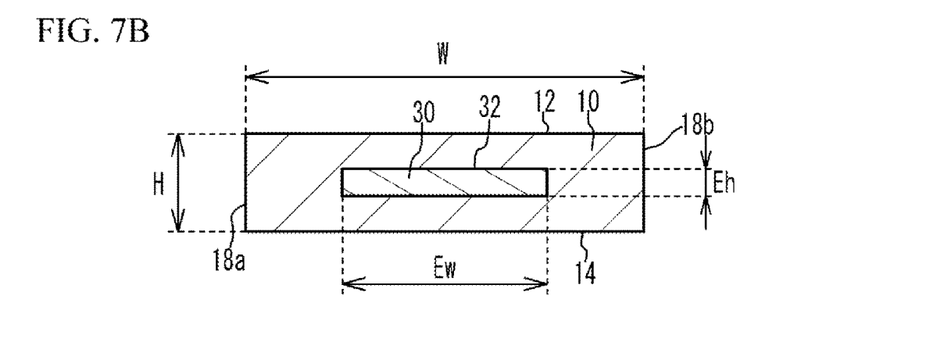
FIG. 7B is a view of cross-section A-A in FIG. 7A
Figure 7C:
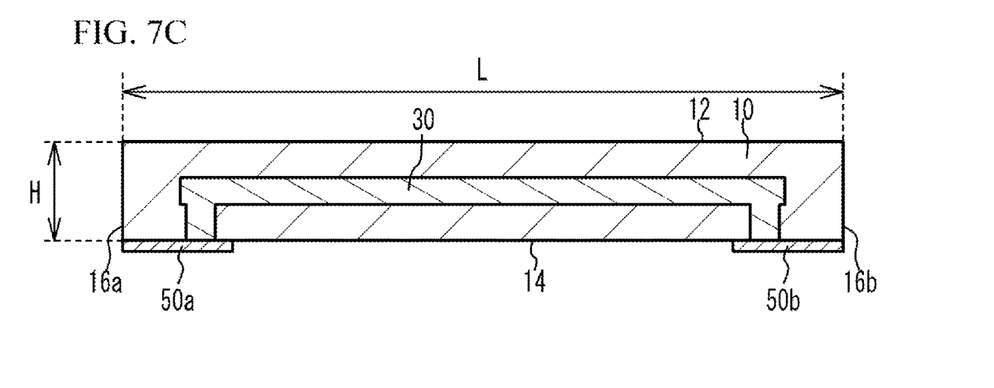
FIG. 7C is a view of cross-section B-B in FIG. 7A.

FIG. 7A is a perspective view of the inductance element pertaining to Example 4, while FIG. 7B is a view of cross-section A-A in FIG. 7A and FIG. 7C is a view of cross-section B-B in FIG. 7A. As shown in FIGS. 7A to 7C, the inductance element 400 in Example 4 is such that both ends of the internal conductor 30 are exposed from the substrate body 10 on the bottom face 14 of the substrate body 10. The internal conductor 30 has one end connected to the external electrode 50a on the bottom face 14 of the substrate body 10, and the other end connected to the external electrode 50b on the bottom face 14 of the substrate body 10. As described, the external electrodes 50a, 50b are provided at least on the bottom face 14 of the substrate body 10.

While Examples 1 to 3 illustrated examples of connecting the internal conductor 30 to the external electrodes 50a, 50b on the end faces 16a, 16b of the substrate body 10, the internal conductor 30 may be connected to the external electrodes 50a, 50b on the bottom face 14 of the substrate body 10, as in Example 4. It should be noted that, while not illustrated, the internal conductor 30 may be connected to the external electrodes 50a, 50b on other faces of the substrate body 10.

Example 5

Figure 8:
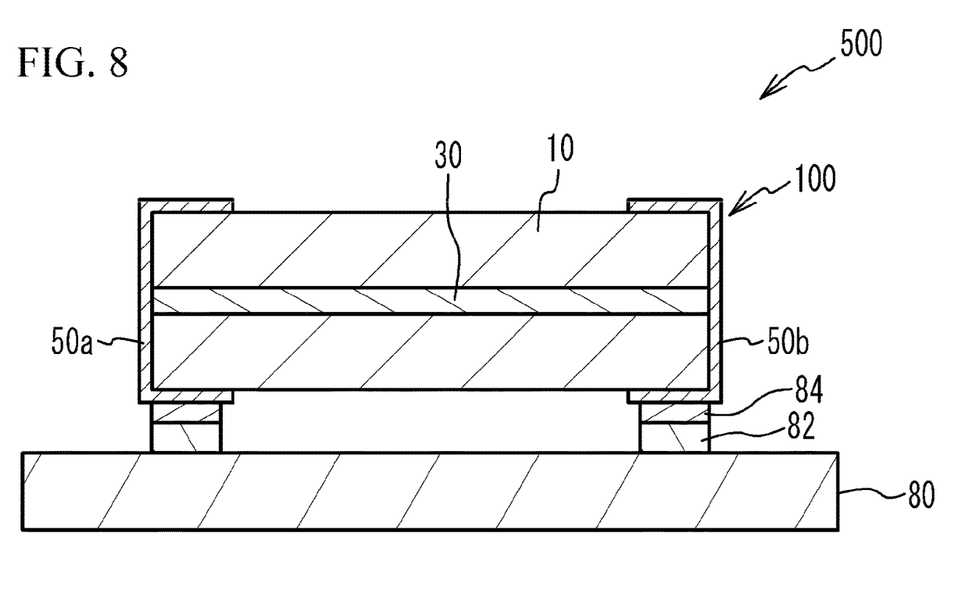
FIG. 8 is a cross-sectional view of the electronic device pertaining to Example 5.

FIG. 8 is a cross-sectional view of the electronic device pertaining to Example 5. As shown in FIG. 8, the electronic device 500 in Example 5 comprises a circuit board 80 and the inductance element 100 in Example 1 that has been mounted on the circuit board 80. The inductance element 100 is mounted on the circuit board 80 through joining of the external electrodes 50a, 50b to the land electrodes 82 on the circuit board 80 with a solder 84.

According to the electronic device 500 in Example 5, the inductance element 100 is mounted on the circuit board 80. This way, an electronic device 500 with an inductance element 100 offering improved direct-current superimposition properties, can be obtained. It should be noted that, while Example 5 illustrates an example where the inductance element 100 in Example 1 is mounted on the circuit board 80, any of the inductance elements in Examples 2 to 4 may be mounted instead.

The foregoing described the examples of the present invention in detail; however, the present invention is not limited to these specific examples, and various modifications and changes may be added so long as doing so does not deviate from the key points of the present invention as described in "What Is Claimed Is."

We claim:
1. An inductance element, comprising:
   a substrate body having insulation property which has a rectangular solid shape specified by its length dimension L, height dimension H, and width dimension W, where a ratio of the width dimension W to the height dimension H, or W/H value, is 1.5 or greater;
   at least one internal conductor which is built in the substrate body and capable of making an electrical current flow therethrough in one uniform direction orthogonal to a cross-section of the substrate body defined by the height and width of the substrate body; and
   a pair of external electrodes which are provided on a surface of the substrate body in a manner respectively connected to both ends of the at least one internal conductor, so that the at least one internal conductor can make an electrical current flow therethrough in the one uniform direction orthogonal to the cross-section;
   wherein the at least one internal conductor is entirely, except for the both ends thereof, enclosed by and in contact with a magnetic material constituting the substrate body, and
   wherein the substrate body has a space for accommodating and surrounding the at least one internal conductor in a manner contacting outermost positioned portions of the at least one internal conductor in the height direction and width direction, which space is referred to as a rectangular internal conductor region, and, in the cross-section of the substrate body, a height dimension of an opening of the space is denoted by Eh and a width dimension of the opening of the space is denoted by Ew, wherein a ratio of the width dimension Ew, to the height dimension Eh, of the internal conductor region, or Ew/Eh value, is greater than a ratio of the width dimension W, to the height dimension H, of the substrate body, or W/H value.

2. The inductance element according to claim 1, wherein dimensions of the substrate body satisfy "Length dimension L>Width dimension W>Height dimension H."

3. The inductance element according to claim 1, wherein the substrate body is formed in a manner containing a magnetic metal material or ferrite material, and the at least one internal conductor is multiple internal conductors formed in a manner containing at least one type of material selected from silver, copper, and alloys containing at least one of silver and copper.

4. The inductance element according to claim 1, wherein the at least one internal conductor is multiple internal conductors provided in multiple layers in the height direction of the substrate body.

5. An electronic device, comprising:
the inductance element according to claim 1; and
a circuit board on which the inductance element is mounted.

6. The inductance element according to claim 1, wherein the at least one internal conductor is a single internal conductor.

7. The inductance element according to claim 1, wherein the W/H value is 1.5 or greater but smaller than 2, and the value of (Ew/Eh)/(W/H) is 2 or greater but no greater than 4.

8. The inductance element according to claim 1, wherein the W/H value is 2 or greater, the value of (Ew/Eh)/(W/H) is 3 or greater.

* * * * *